United States Patent [19]

Nagamachi

[11] Patent Number: 5,683,595
[45] Date of Patent: Nov. 4, 1997

[54] FINE PATTERN FORMING METHOD AND FINE PATTERN DEVICE

[75] Inventor: Shinji Nagamachi, Nara, Japan

[73] Assignee: Shimadzu Corporation, Kyoto, Japan

[21] Appl. No.: 618,308

[22] Filed: Mar. 18, 1996

[30] Foreign Application Priority Data

Mar. 31, 1995 [JP] Japan .................................. 7-076005

[51] Int. Cl.$^6$ .............................. C23F 4/00; H01L 21/00
[52] U.S. Cl. ...................... 216/66; 216/63; 216/87; 156/643.1; 204/192.34
[58] Field of Search ................... 156/643.1; 204/192.34; 216/65, 66

[56] References Cited

U.S. PATENT DOCUMENTS

| | | | |
|---|---|---|---|
| 3,536,547 | 10/1970 | Schmidt | 156/643.1 |
| 4,874,460 | 10/1989 | Nakagawa et al. | 156/626 |
| 4,983,540 | 1/1991 | Yamaguchi et al. | 437/110 |
| 5,178,726 | 1/1993 | Yu et al. | 156/643.1 |
| 5,215,960 | 6/1993 | Tanaka et al. | 505/1 |
| 5,376,225 | 12/1994 | Wakabayashi et al. | 156/643.1 |

*Primary Examiner*—R. Bruce Breneman
*Assistant Examiner*—Michael E. Adjodha
*Attorney, Agent, or Firm*—Nikaido Marmelstein Murray & Oram LLP

[57] ABSTRACT

A particle beam is irradiated locally to a film of an alloy or compound containing atoms of two or more elements, causing atoms of a specific element in the film to selectively recoil to the outside of the film, such that there is formed, inside of the film, a zone in the form of a pattern in which the rate of the atoms of the specific type is smaller than in other portions of the film. In the fine pattern thus formed, the thickness is substantially equal to that of the film, and other sizes are determined according to the particle beam irradiation zone. For example, when a focused ion beam is used as the particle beam, there can be formed a fine pattern on the 10-nm level with precision of the order of nm. This fine pattern can be a quantum wire, a quantum dot or the like. It is therefore possible to produce, with good reproducibility, a device in which a quantum effect has been utilized.

9 Claims, 1 Drawing Sheet

FINE PATTERN FORMING METHOD AND FINE PATTERN DEVICE

BACKGROUND OF THE INVENTION

The present invention relates to a method of forming a fine pattern in a film, and also to a fine pattern device having a fine pattern formed by this method, such as a quantum effect device or the like.

As technology of forming a quantum film (one-dimensional well structure) in a semiconductor, a method using MBE (molecular beam epitaxy) has already been developed.

To form a quantum wire (two-dimensional well structure) or a quantum dot (three-dimensional well structure), however, there is required technology of two-dimensional fine-machining on the 10-nm level, in addition to a film forming technology for forming a quantum film. However, such technology has not been established yet in an assured status. More specifically, photolithography technology currently established as a two-dimensional fine machining method can assure only precision of about hundreds nm. Thus, such photolithography cannot be used as a method of fine machining for forming a two- of three-dimensional well structure as above-mentioned. As a matter of fact, no method has been put into practical use although a variety of proposals have been made.

BRIEF DESCRIPTION OF THE ATTACHED DRAWINGS

OBJECTS AND SUMMARY OF THE INVENTION

Figure 1:
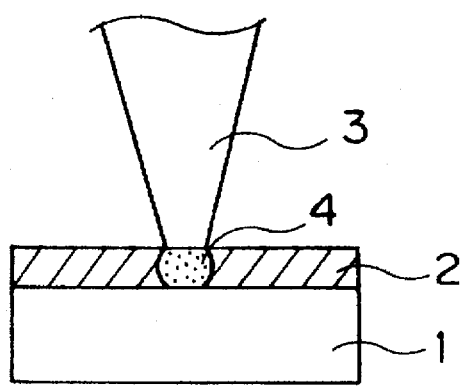
FIG. 1 is a schematic section view of elements illustrating a fine pattern forming process according to an embodiment of the present invention.

It is an object of the present invention to provide a method of mass-producing, with good controllability and good reproducibility, a fine pattern on the 10-nm level with precision of the order of nm such as a quantum wire (two-dimensional fine pattern) or a quantum dot (three-dimensional fine pattern) which could not be produced by prior art, and also to provide a device having such a fine pattern produced by the method above-mentioned.

A fine pattern forming method of the present invention is characterized in that a particle beam is irradiated locally to a film of an alloy or compound containing atoms of two or more elements, causing atoms of a specific type in the film to selectively recoil to the outside of the film, such that there is formed a zone in the form of a pattern in which the rate of atoms of the specific element is smaller than in other portions of the film.

According to the method of the present invention, an ion beam or a neutral atomic beam may be used as the particle beam to be irradiated to a film, and a focused or non-focused particle beam may be used as the form of the particle beam. When a fine pattern is to be formed using a non-focused particle beam, a mask having the desired pattern may be used as necessary.

In addition to direct irradiation of a particle beam to the surface of a target film, the present invention also includes the following case. That is, there is formed a laminated structure in which a target film is held by and between layers made of a substance different from the substance of the target film, and a particle beam is irradiated to an end surface of the laminated structure at such an angle that the beam intersects the target film. Thus, there is formed, in the target film, a zone in the form of a pattern which has a depth corresponding to the range of the particle beam, a thickness substantially equal to the thickness of the film and a width substantially equal to the beam width of the particle beam, and in which the rate of the atoms of the specific type is smaller than in other portions of the film.

The following description will discuss the principle of the fine pattern forming method of the present invention characterized in the steps above-mentioned.

For example, when a high-speed particle beam or focused ion beam is irradiated to a film of a substance AB which is a compound of a substance A (comprising atoms A) and a substance B (comprising atoms B) and of which physical properties are different from those of the substance A, beam particles come into collision with atoms A and B forming the film, causing the atoms A or B to recoil. The atoms A or B which have recoiled, move by a range corresponding to the recoiling energy. When the atoms A and B are different in mass from each other, the atoms A and B are also different in range. For example, when the mass of the atoms B is smaller, the range of the atoms B is greater than that of the atoms A. When the range of the atoms B is great such that the atoms B pass through the film and the range of the atoms A is small such that the atoms A do not pass through the film, the atoms B are selectively driven out from the film of the substance AB (kick-out effect). Thus, a zone richer in atoms A is formed only in the beam irradiated zone. Accordingly there is formed, in the film, a fine pattern having a composition different from that of other portions of the film.

When there is gradually increased the number of atoms B which recoil due to the particle beam, the composition of the beam irradiated zone approaches to that of the substance A. It is therefore possible to form, in the film AB, a fine pattern made of a substance substantially similar to the substance A.

On the other hand, when there is formed a laminated structure in which a film made of a substance AB similar to the substance AB above-mentioned, is held by and between layers of other substance, and a particle beam is irradiated to an end surface of the laminated structure at such an angle that the particle beam intersects the film AB, a beam irradiated zone is formed at a position of which depth from the end surface above-mentioned, is determined by the range of the particle beam. The zone where the beam irradiated zone and the film AB intersect each other, is rich in atoms A. Thus, by controlling the energy of the particle beam, a two-dimensional pattern on the 10 nm-level can readily be formed with good controllability and good reproducibility.

A fine pattern obtained by the method of the present invention above-mentioned, has a thickness substantially equal to the thickness of the film. When a convergent ion beam is used and irradiated in a spot, the resulting fine pattern becomes a dot (quantum dot) having sizes equal to the sizes of section of the beam. When a film is scanned by a focused ion beam, the resulting fine pattern becomes a line (quantum wire) having a width equal to the beam size. When a mask is used, the resulting fine pattern has a thickness substantially equal to the thickness of the film and the shape and sizes of the fine pattern are equal to the shape and sizes of the mask pattern.

According to the fine pattern forming method of the present invention, a two- or three-dimensional fine pattern with precision of the order of nm can be formed with good reproducibility by a relatively simple process excellent in controllability such as irradiation of a convergent ion beam, irradiation of a particle beam through a mask or the like without the target film removed at its unnecessary portions as done in photolithography of prior art established as machining technology for forming a two-dimensional fine pattern.

When there is adopted a method in which a particle beam is irradiated to an end surface of a laminated structure in which a target film is held by and between layers of other substance, it is possible to form a two- or three-dimensional fine pattern in the desired zone of the film which is not being exposed to the outside.

A fine pattern device according to the present invention is a device formed with the use of the method of the present invention above-mentioned, and is characterized in that there is formed, inside of a film of an alloy or compound containing atoms of two or more elements, a zone in the form of a fine pattern in which the rate of the atoms of specific type is smaller than in other portions of the film.

A specific example of the fine pattern device of the present invention, includes a structure in which a particle beam is irradiated to an insulating film of a metallic oxide for example, causing oxygen atoms to be selectively kicked out, such that the insulating film is provided inside thereof with a fine conductive pattern.

Another specific example of the fine pattern device of the present invention, includes a structure in which a particle beam is irradiated to a $SiO_2$ film to cause oxygen atoms to selectively recoil, such that there is formed a device in which the $SiO_2$ film is provided inside thereof with a fine Si or Si-rich pattern.

A further specific example of the fine pattern device of the present invention, includes a structure in which a particle beam is irradiated to an $AgCl_2$ film, causing Cl atoms to be selectively kicked out, such that there is formed a device in which the dielectric film is provided inside thereof with a fine conductive pattern.

Still another specific example of the fine pattern device of the present invention, includes a structure in which a particle beam is irradiated to a film made of an oxide of a metallic super conductor, causing oxygen atoms to be selectively kicked out such that there is formed a device in which the insulating film is provided inside thereof with a fine super conductive film.

Further, according to the method of the present invention, a particle beam may be irradiated to a film made of an organic compound, causing atoms of a specific element to be kicked out, thereby to form a fine pattern in which the rate of the atoms of the specific element is smaller and which consequently has a composition different from that of other zone of the film.

Further, according to the method of the present invention, a particle beam may be irradiated to a film made of an alloy, causing atoms of a specific element in the alloy composition to be kicked out, thereby to form a fine pattern having a composition different from that of the alloy or made of single metal.

DESCRIPTION OF PREFERRED
EMBODIMENTS OF THE INVENTION

The following description will discuss preferred embodiments of the present invention with reference to the attached drawings.

As shown in a schematic section view of elements in the course of a fine pattern forming processing in FIG. 1, there is formed, on the surface of a substrate 1, a film 2 which is a compound of a substance A (comprising atoms A) and a substance B (comprising atoms B) and which is formed by a substance AB of which physical properties are different from those of the substance A. The film 2 has a thickness of about 10 nm. The atoms of the substance A are greater in mass than the atoms of the substance B, and the difference in mass is preferably great. Such a combination includes an example in which the substance A comprises metallic or semiconductor atoms and the substance B is for example oxygen, nitrogen, hydrogen or the like of which physical properties undergo a great change when bonded to the substance A, and of which mass is considerably different from that of the substance A.

A focused ion beam (for example, metallic focused ion beam or gaseous focused ion beam) 3 having an energy of about several keV to about dozens keV, is irradiated to the film 2 formed by the substance AB above-mentioned. Ions forming the focused ion beam 3 come into collision with atoms A and B forming the film 2, causing the atoms A and B to recoil. The ranges of the atoms A and B at the time when the atoms A and B have recoiled, are different from each other due to the difference in mass therebetween, and the range of the atoms B is greater than the range of the atoms A. Thus, the atoms B are selectively kicked out from a zone 4 of the film 2 to which the focused ion beam 3 is irradiated. As a result, the irradiation zone 4 has physical properties identical with or similar to the physical properties of the substance A. By suitably scanning the film 2 by the focused ion beam 3, it is possible to form, inside of the film 2, an optional fine pattern corresponding to the portions to which the focused ion beam 3 has been irradiated. As to the measurements of the pattern thus formed, the thickness is equal to that of the film 2, and the sizes in other directions and the precision are determined based on the sectional sizes and precision of the focused ion beam 3.

At least a portion of the ions forming the focused ion beam 3, is injected into the film 2. However, when there is used, as the beam source, the substance A as it is or an element which does not damage the physical properties of the substance A, it is possible to restrain the influence of ions of the focused ion beam 3 injected into the film 2.

In the embodiment above-mentioned, the thickness of the film 2 and the sectional sizes of the focused ion beam 3 can readily be controlled with precision of the order of nm. Thus, according to this embodiment, it is possible to produce a variety of devices using, for example, a quantum effect, in each of which the film 2 is provided inside thereof with a fine pattern with precision of the order of nm which has physical properties different from those of other portion of the film 2.

Figure 2:
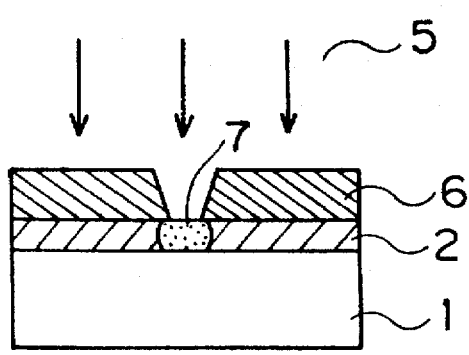
FIG. 2 is also a schematic section view of elements illustrating a fine pattern forming process according to another embodiment of the present invention.

FIG. 2 is a schematic section view of elements in the course of a pattern forming processing according to another embodiment of the present invention, in which a non-focused high-speed particle beam 5 is used. In this embodiment, there is formed, on the surface of a substrate 1, a film 2 formed by a substance AB which is a compound of substances A and B, likewise in the embodiment in FIG. 1. Then, a mask 6 having the desired pattern is disposed on the surface of the film 2, and the non-focused high-speed particle beam 5 is irradiated to the film 2 through the mask 6. The high-speed particles having passed through the mask 6, come into collision with atoms A and B forming the film 2. Likewise in the embodiment in FIG. 1, the atoms B smaller in mass selectively recoil to the outside of the film 2. As a result, there is formed, inside of the film 2 formed by the substance AB, a zone 7 having physical properties identical with or similar to those of the substance A.

In the zone 7 in FIG. 2, the thickness is equal to that of the film 2 and other sizes and precision are determined by the pattern sizes and precision of the mask 6.

Figure 3:
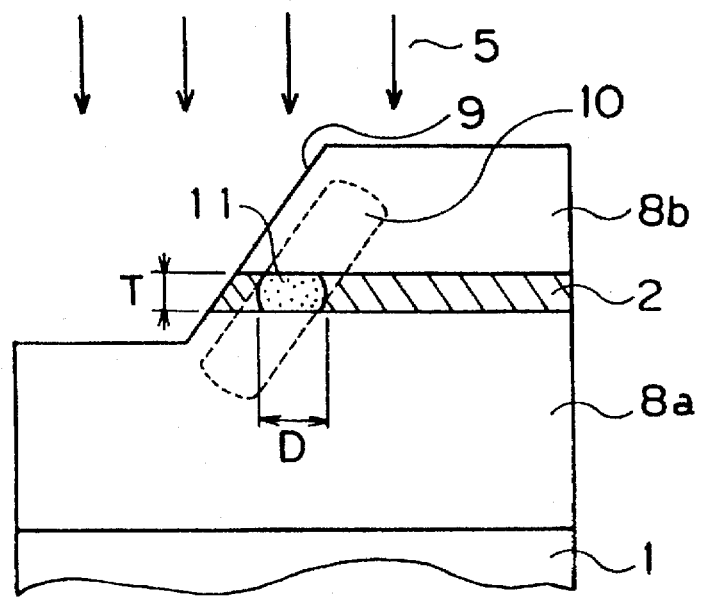
FIG. 3 is a schematic section view of elements illustrating a fine pattern forming process according to a further embodiment of the present invention.

FIG. 3 is a schematic section view of elements in the course of a pattern forming processing according to a further embodiment of the present invention, in which a fine pattern is to be formed in a film 2 at its portion which is not exposed to the outside.

According to the embodiment in FIG. 3, a film 8a of a substance C is first formed on the surface of a substrate 1, and a film 2 of a substance AB similar to the substance AB in each of the embodiments above-mentioned, is then formed on the surface of the film 8a. Then, a film 8b of a substance C is formed on the surface of the film 2, thus forming a laminated structure in which the film 2 of the substance AB is held by and between the films 8a, 8b of the substance C different from the substance AB.

Then, the laminated structure is partially subjected to etching or the like. This causes the film 2 to be exposed at an end surface thereof to the outside and there is formed an end surface 9 inclined with respect to the direction of normal line of the substrate 1. Then, a high-speed particle beam 5 similar to that in the embodiment in FIG. 2, is irradiated to the end surface 9 of the laminated structure in the direction of normal line of the substrate 1. Particles of the irradiated beam 5 are injected to the depth determined by the energy. Thus formed in the laminated structure is a layered particle-injected zone 10 having a predetermined depth from the end surface 9. At the zone 11 where the layered particle-injected zone 10 crosses the film 2, particles of the beam 5 come into collisions with atoms A and B likewise in each of the embodiments above-mentioned. Then, the atoms B selectively recoil to the outside of the film 2.

Thus, as done in each of the embodiments above-mentioned, the intersecting zone 11 undergoes a change in composition and has physical properties identical with or similar to those of the substance A. In the intersecting zone 11, the thickness T is equal to the thickness of the original film 2, the depth D is determined by the dispersion of particle range, and the average distance between the end surface 9 and the zone 11 is determined by the average range of particles. Generally, since the energy of particle beam can precisely be controlled, the depth D of the zone 11 can readily be controlled with precision of the order of nm. Thus, there can be formed a two-dimensional fine pattern 11 having the thickness T and depth D which are on the 10-nm level with precision of the order of nm.

In the embodiment in FIG. 3, when a focused ion beam is used as the beam 5, not only the thickness and depth D, but also the width (in the direction at a right angle to the drawing plane) can be controlled by the beam sizes. Thus, a three-dimensional fine pattern can be prepared.

In each of the embodiments above-mentioned, a difference in range between the substances A and B at the time when the substances A and B have recoiled, is mainly utilized such that one substance B is kicked out. However, it is known that, when the substance B to be kicked out is used as the beam source, the recoiling energy given to the substance B is maximized. It is therefore possible to irradiate a particle beam of the substance B to the film 2 to effectively kick out the substance B.

The structural features of a fine pattern prepared by the method of the present invention above-mentioned, reside in that a fine pattern of a specific substance is formed inside of a film of a substance different from the specific substance, and in that the pattern sizes can readily be finished on the 10-nm level with precision of the order of nm.

According to photolithography technology of prior art, an even film of a substance by which a fine pattern is to be formed, is formed on the surface of a substrate or the like, and the film is then patterned by removing its unnecessary portions. Accordingly, the resulting fine pattern is made in a structure in which the remaining film substance is being placed in a predetermined pattern on the surface of the substrate or the like. Further, fine machining according to such photolithography can merely assure dimensional precision on the plane only of the order of 100 nm.

Therefore, a fine pattern device according to the present invention is apparently different in structure and dimensional precision by about one digit from a fine pattern device made using a photolithography technology of prior art.

The following description will discuss fine pattern devices according to embodiments of the present invention with reference to the drawings illustrating the fine pattern forming methods according to preferred embodiments of the present invention.

When a focused ion beam 3 or high-speed particle beam 5 is irradiated to a film 2 made of a metallic oxide such that oxygen atoms are selectively kicked out, there is formed a device in which the insulating film 2 of metallic oxide is provided inside thereof with a fine conductive pattern 4, 7, 11.

When a focused ion beam 3 or high-speed particle beam 5 is irradiated to a $SiO_2$ film 2 such that oxygen atoms are selectively kicked out, there is formed a device in which the $SiO_2$ insulating film 2 is provided inside thereof with a fine Si or Si-rich pattern 4, 7, 11.

When a focused ion beam 3 or high-speed particle beam 5 is irradiated to an $AgCl_2$ film 2 such that chlorine atoms are selectively kicked out, there is formed a device in which the $AgCl_2$ dielectric film is provided inside thereof with a fine conductive pattern 4, 7, 11 of Ag.

When a focused ion beam 3 or high-speed particle beam 5 is irradiated to a film 2 made of an oxide of a metallic super conductor, e.g., $Nb_2O_5$, such that oxygen atoms are selectively kicked out, there is formed a device in which the insulating film 2 of $Nb_2O_5$ is provided inside thereof with a fine super conductive film 4, 7, 11 of Nb.

In each of the devices having the compositions of matter above-mentioned, the shape of the fine pattern 4, 7, 11 is not limited to a specific one, but may be optional. However, since there can be formed a fine pattern on the 10-nm level with precision of the order of nm, there can be formed a device in which a quantum effect has sufficiently be utilized.

It is now supposed that the element structure in FIG. 3 is used and the film 2 is made of $Nb_2O_5$ and the upper and lower films 8a, 8b are made of Nb. Then, when the oxygen elements in the zone 11 are selectively kicked out, there is formed a solid Josephson junction in which two Nb super conductor films 8a, 8b are bonded to each other through a bridge 11 of a fine Nb super conductor. Thus, there can be obtained a super conduction device such as SQUID or the like with good reproducibility.

By using the fine pattern forming method of the present invention, there can be obtained not only the above-mentioned devices in which a quantum effect has been utilized, but also a fine pattern having any of the following compositions of matter, although its industrial application will be a subject for further discussion.

For example, when a beam is irradiated to a film 2 of an organic compound such that atoms of a specific type, e.g., hydrogen, oxygen, nitrogen or metallic atoms, are kicked out, there can be formed a fine pattern which is reduced in the rate of such specific atoms and which has a composition different from that of other zones.

Further, when a beam is irradiated to an alloy film 2 such that atoms of a specific type in the alloy composition, are kicked out, there can be formed, in the alloy film, a pattern which is made of metal different in composition from the alloy, or which is made of single metal.

What is claimed is:

1. A fine pattern forming method comprising the steps of:

forming a one layer film of an alloy or compound containing atoms of two or more elements on a substrate;

irradiating a particle beam locally to said film of the alloy or compound containing atoms of two or more elements;

causing atoms of a specific element in said film to selectively recoil to an outside of said film by passing the specific element through said film; and forming, inside of said film, a zone in a form of a pattern, said zone having a rate of the atoms of said specific element being smaller than in portions of said film outside said zone.

2. A fine pattern forming method according to claim 1, wherein said particle beam is a focused ion beam.

3. A fine pattern forming method according to claim 1, wherein said particle beam is a neutral atomic beam, which is irradiated to said film through a mask in which a pattern has previously been formed.

4. A fine pattern forming method according to any of claims 1, 2, 3 wherein said film forms a portion of a laminated structure in which said film is coated at each of both sides thereof with a layer made of a substance different from the substance forming said film, and said particle beam is irradiated to an end surface of said laminated structure at such an angle that said irradiated beam intersects said film.

5. A fine pattern device having a fine pattern formed with the use of a film, comprising:

a substrate; and a one layer film of an alloy or compound containing atoms of two or more elements, said film formed on said substrate, wherein a zone in a form of a fine pattern is formed within said film, said zone having a rate of the atoms of a specific element being smaller than in portions of said film outside of said zone by the specific element passing through said film.

6. A fine pattern device according to claim 5, wherein a fine conductive pattern is formed inside of an insulating film made of a metallic oxide.

7. A fine pattern device according to claim 5, wherein a fine Si or Si-rich pattern is formed inside of a $SiO_2$ insulating film.

8. A fine pattern device according to claim 5, wherein a fine Ag conductor pattern is formed inside of an $AgCl_2$ dielectric film.

9. A fine pattern device according to claim 5, wherein a fine pattern of a metallic super conductor is formed inside of an insulating film of an oxide of a metallic super conductor.

* * * * *